United States Patent
He et al.

(10) Patent No.: US 12,232,358 B2
(45) Date of Patent: Feb. 18, 2025

(54) ORGANIC ELECTROLUMINESCENT DISPLAY MODULE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jian He, Beijing (CN); Yu Zhang, Beijing (CN); Feng Xiao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 381 days.

(21) Appl. No.: 17/771,823

(22) PCT Filed: Jun. 1, 2021

(86) PCT No.: PCT/CN2021/097747
§ 371 (c)(1),
(2) Date: Apr. 26, 2022

(87) PCT Pub. No.: WO2021/249246
PCT Pub. Date: Dec. 16, 2021

(65) Prior Publication Data
US 2022/0376214 A1    Nov. 24, 2022

(30) Foreign Application Priority Data

Jun. 10, 2020   (CN) .......................... 202010525529.0

(51) Int. Cl.
*H01L 51/50*    (2006.01)
*H10K 50/86*    (2023.01)
(Continued)

(52) U.S. Cl.
CPC ........... *H10K 50/865* (2023.02); *H10K 59/38* (2023.02); *H10K 59/12* (2023.02); *H10K 59/40* (2023.02); *H10K 2102/331* (2023.02)

(58) Field of Classification Search
None
See application file for complete search history.

(56) References Cited

U.S. PATENT DOCUMENTS

| | | |
|---|---|---|
| 2007/0200492 A1 | 8/2007 | Cok et al. |
| 2015/0014655 A1 | 1/2015 | Yun et al. |
| 2017/0102487 A1 | 4/2017 | Lee et al. |

(Continued)

FOREIGN PATENT DOCUMENTS

| | | |
|---|---|---|
| CN | 203895462 U | 10/2014 |
| CN | 104282718 A | 1/2015 |

(Continued)

OTHER PUBLICATIONS

International Search Report for PCT/CN2021/097747 Mailed Sep. 2, 2021.

(Continued)

*Primary Examiner* — Anthony Ho
(74) *Attorney, Agent, or Firm* — Ling Wu; Stephen Yang; Ling and Yang Intellectual Property

(57) ABSTRACT

An organic electroluminescent display module and a manufacturing method therefor, and a display device. The organic electroluminescent display module comprises: a base substrate, an organic electroluminescent device, and a light absorption layer; the organic electroluminescent device is on the base substrate, and the light absorption layer is on the side of the organic electroluminescent device away from the base substrate; the light absorption layer comprises a modified color filtering layer, or a color filtering layer and a modified optically clear adhesive layer on one side of the color filtering layer; the modified color filtering layer at least (Continued)

comprises a red modified layer, a green modified layer, and a blue modified layer; the red modified layer, the green modified layer, and the blue modified layer are all provided with nanoparticles for absorbing ambient light; and the modified optically clear adhesive layer is provided with nanoparticles for absorbing ambient light.

17 Claims, 12 Drawing Sheets

(51) Int. Cl.
*H10K 59/38* (2023.01)
*H10K 59/12* (2023.01)
*H10K 59/40* (2023.01)
*H10K 102/00* (2023.01)

(56) References Cited

U.S. PATENT DOCUMENTS

| | | |
|---|---|---|
| 2020/0058888 A1 | 2/2020 | Sugiyama et al. |
| 2020/0075682 A1 | 3/2020 | Jeong et al. |

FOREIGN PATENT DOCUMENTS

| | | |
|---|---|---|
| CN | 105304684 A | 2/2016 |
| CN | 107852787 A | 3/2018 |
| CN | 108957836 A | 12/2018 |
| CN | 109103344 A | 12/2018 |
| CN | 110085638 A | 8/2019 |
| CN | 110611035 A | 12/2019 |
| CN | 110867466 A | 3/2020 |
| CN | 110957348 A | 4/2020 |
| CN | 111628109 A | 9/2020 |

OTHER PUBLICATIONS

Office Action dated Mar. 3, 2022 for Chinese Patent Application No. 202010525529.0 and English Translation.
Office Action dated Aug. 16, 2022 for Chinese Patent Application No. 202010525529.0 and English Translation.
Office Action dated Oct. 24, 2023 for Chinese Patent Application No. 202010525529.0 and English Translation.
Office Action dated Jan. 12, 2024 for Chinese Patent Application No. 202010525529.0 and English Translation.

ORGANIC ELECTROLUMINESCENT DISPLAY MODULE AND MANUFACTURING METHOD THEREFOR, AND DISPLAY DEVICE

CROSS-REFERENCE TO RELATED APPLICATIONS

The present application is a U.S. National Phase Entry of International Application PCT/CN2021/097747 having an international filing date of Jun. 1, 2021, which claims priority of Chinese patent application No. 2020105255290, entitled "Organic Electroluminescent Display Module and Manufacturing Method therefor, and Display Device", filed to the CNIPA on Jun. 10, 2020, the contents disclosed in the above-mentioned application are hereby incorporated as a part of this application.

TECHNICAL FIELD

Embodiments of the present disclosure relate to, but are not limited to, the field of display technology, and in particular to an organic electroluminescent display module and a display device.

BACKGROUND

Intelligent terminals, such as mobile phones, tablets, notebook computers, put higher and higher demands on contrast ratio of a display module, which requires increasing a maximum luminance of the display module as much as possible. For example, on the premise of a fixed luminance, improving light transmittance of components in front of a luminous area, and reducing a black screen luminance of a display screen can be lowered, means reducing reflection of the display screen itself to ambient light.

Organic Light Emitting Diode (OLED) is a new generation of display technology, which is being applied in more and more smart phones. Conventional OLED display modules use circular polarizers to reduce the reflection to the ambient light, while light transmittance of a circular polarizer is about 43%, which makes most of light emission of OLED unusable.

SUMMARY

The following is a summary of subject matters described herein in detail. The summary is not intended to limit the scope of protection of claims.

In a first aspect, an embodiment of the present disclosure provides an organic electroluminescent display module, including: a base substrate, an organic electroluminescent device, and a light absorption layer.

The organic electroluminescent device is located on the base substrate, and the light absorption layer is located on a side of the organic electroluminescent device away from the base substrate.

The light absorption layer includes a modified color filtering layer, or includes a color filtering layer and a modified optically transparent adhesive layer located on a side of the color filtering layer.

The modified color filtering layer at least includes a red modified layer, a green modified layer and a blue modified layer. The red modified layer is disposed at a position where a red sub-pixel needs to be formed, the green modified layer is disposed at a position where a green sub-pixel needs to be formed, and the blue modified layer is disposed at a position where a blue sub-pixel needs to be formed; each of the red modified layer, the green modified layer and the blue modified layer is provided with nanoparticles configured to absorb ambient light;

The color filtering layer at least includes a red filtering layer, a green filtering layer and a blue filtering layer; the red filtering layer is disposed at a position where a red sub-pixel needs to be formed, the green filtering layer is disposed at a position where a green sub-pixel needs to be formed, and the blue filtering layer is disposed at a position where a blue sub-pixel needs to be formed; the modified optically transparent adhesive layer is provided with the nanoparticles configured to absorb the ambient light.

Optionally, the red modified layer, the green modified layer and the blue modified layer each contain a photoluminescent material.

The organic electroluminescent device includes an organic light emitting layer including a blue organic light emitting layer or an ultraviolet organic light emitting layer.

Optionally, when light emitted by the organic light emitting layer is used as a basic light source, it is determined whether the red modified layer, the green modified layer and the blue modified layer contain the photoluminescent material according to the basic light source.

Optionally, the modified optically transparent adhesive layer is disposed on a side of the color filtering layer away from the organic electroluminescent device.

Optionally, the organic electroluminescent display module further includes a touch structure.

The touch structure is located on a side of the modified color filtering layer close to the organic electroluminescent device; or,
 the touch structure is located on a side of the modified color filtering layer away from the organic electroluminescent device.

Optionally, the light absorption layer further includes an antireflection film configured to absorb the ambient light.

The antireflection film is located on a side of the modified color filtering layer away from the touch structure; or,
 the antireflection film is located between the modified color filtering layer and the touch structure.

Optionally, the red modified layer, the green modified layer and the blue modified layer are provided therein with nanoparticles of a same material; or,
 the red modified layer is provided therein with nanoparticles of a first material, the green modified layer is provided therein with nanoparticles of a second material, and the blue modified layer is provided therein with nanoparticles of a third material.

The nanoparticles of the first material are configured to absorb light with a wavelength of 650 nm or more in the ambient light, the nanoparticles of the second material are configured to absorb light with a wavelength of 500 nm or less in the ambient light, and the nanoparticles of the third material are configured to absorb light with a wavelength of 410 nm or less in the ambient light.

Optionally, each of the red filtering layer, the green filtering layer and the blue filtering layer is provided therein with the photoluminescent material.

The organic electroluminescent device includes the organic light emitting layer including the blue organic light emitting layer or including the ultraviolet organic light emitting layer.

Optionally, the organic electroluminescent display module further includes a touch structure.

The modified optically transparent adhesive layer is located on a side of the color filtering layer away from the organic electroluminescent device, and the touch structure is located on a side of the color filtering layer close to the organic electroluminescent device; or, the modified optically transparent adhesive layer is located on the side of the color filtering layer away from the organic electroluminescent device, and the touch structure is located between the color filtering layer and the modified optically transparent adhesive layer; or, the modified optically transparent adhesive layer is located on the side of the color filtering layer close to the organic electroluminescent device, and the touch structure is located on a side of the modified optically transparent adhesive layer close to the organic electroluminescent device; or, the modified optically transparent adhesive layer is located on the side of the color filtering layer close to the organic electroluminescent device, and the touch structure is located on the side of the color filtering layer away from the organic electroluminescent device; or, the modified optically transparent adhesive layer is located on the side of the color filtering layer close to the organic electroluminescent device, and the touch structure is located between the color filtering layer and the modified optically transparent adhesive layer; or, the modified optically transparent adhesive layer is located on the side of the color filtering layer away from the organic electroluminescent device, and the touch structure is located on a side of the modified optically transparent adhesive layer away from the color filtering layer.

Optionally, the light absorption layer further includes an antireflection film configured to absorb the ambient light.

The antireflection film is located between the color filtering layer and the modified optically transparent adhesive layer; or, the antireflection film is located on the side of the modified optically transparent adhesive layer away from the color filtering layer; or, the antireflection film is located on a side of the color filtering layer away from the modified optically transparent adhesive layer.

Optionally, the modified optically transparent adhesive layer is provided therein with nanoparticles of a same material; or, the modified optically transparent adhesive layer includes a first sub-modified optically transparent adhesive layer, a second sub-modified optically transparent adhesive layer and a third sub-modified optically transparent adhesive layer; the first sub-modified optically transparent adhesive layer is provided therein with nanoparticles of a first material, the second sub-modified optically transparent adhesive layer is provided therein with nanoparticles of a second material and the third sub-modified optically transparent adhesive layer is provided therein with nanoparticles of a third material are disposed;

a position of the first sub-modified optically transparent adhesive layer corresponds to a position of the red filtering layer, a position of the second sub-modified optically transparent adhesive layer corresponds to a position of the green filtering layer, and a position of the third sub-modified optically transparent adhesive layer corresponds to a position of the blue filtering layer;

the nanoparticles of the first material are configured to absorb light with a wavelength of 650 nm or more in the ambient light, the nanoparticles of the second material are configured to absorb light with a wavelength of 500 nm or less in the ambient light, and the nanoparticles of the third material are configured to absorb light with a wavelength of 410 nm or less in the ambient light.

In a second aspect, an embodiment of the present disclosure provides a display device including the organic electroluminescent display module as described in the first aspect.

In a third aspect, an embodiment of the present disclosure provides a method for preparing an organic electroluminescent display module. The organic electroluminescent display module includes: a base substrate, an organic electroluminescent device, and a light absorption layer, and the preparation method includes:

forming the organic electroluminescent device on the base substrate, and forming the light absorption layer on a side of the organic electroluminescent device away from the base substrate, wherein:

the light absorption layer includes a modified color filtering layer, or includes a color filtering layer and a modified optically transparent adhesive layer located on a side of the color filtering layer;

the modified color filtering layer at least includes a red modified layer, a green modified layer and a blue modified layer; the red modified layer is disposed at a position where a red sub-pixel needs to be formed, the green modified layer is disposed at a position where a green sub-pixel needs to be formed, and the blue modified layer is disposed at a position where a blue sub-pixel needs to be formed; the red modified layer, the green modified layer and the blue modified layer are each provided therein with nanoparticles configured to absorb ambient light;

the color filtering layer at least includes a red filtering layer, a green filtering layer and a blue filtering layer; the red filtering layer is disposed at a position where a red sub-pixel needs to be formed, the green filtering layer is disposed at a position where a green sub-pixel needs to be formed, and the blue filtering layer is disposed at a position where a blue sub-pixel needs to be formed; the modified optically transparent adhesive layer is provided therein with the nanoparticles configured to absorb the ambient light.

Other aspects may be understood upon reading and understanding of the accompanying drawings and detailed descriptions.

BRIEF DESCRIPTION OF DRAWINGS

FIGS. 5a-5l are schematic diagrams of structures of a color filtering layer, a modified optically transparent adhesive layer and a touch structure included in an organic electroluminescent display module according to an embodiment of the present disclosure.

DETAILED DESCRIPTION

Embodiments of the present disclosure will be described in detail below, and the embodiments described below with reference to the drawings are exemplary and are only for explaining the present disclosure and cannot be construed as limitations on the present disclosure.

It can be understood by those skilled in the art that unless otherwise defined, all terms (including technical terms and scientific terms) used herein have the same meanings as commonly understood by those of ordinary skills in the art that to which the present disclosure pertains. It should also be understood that terms defined in, for example, a general dictionary, should be understood as having the same meanings as those in the context of the prior art, and may not be explained as idealized or too formal meanings, unless specifically defined as herein.

It can be understood by those skilled in the art that unless otherwise specified, the singular forms "one", "a/an", "said", and "the" used herein may also include plural forms. It should further be understood that wording "include" used in the specification of the present disclosure refers to existence of feature, integer, step, operation, element, and/or component, but does not exclude existence or addition of one or more other features, integers, steps, operations, elements, components, and/or combinations thereof. It should be understood that an element referred to as being "connected" to another element may be connected to another element directly or through an intermediate element. In addition, "connection" used herein may include wireless connection. Wording "and/or" used herein includes all or any one and all combinations of one or more listed items that are associated.

Light transmittance of a color filter (CF) is higher than 80%. In some technologies, light transmittance of an organic light emitting diode display module is low. Color filters may be used for replacing circular polarizers in these technologies. Color filters can greatly increase the output of OLED light emission, thus improving brightness.

However, after passing through the color filter, ambient light will be reflected by a metal electrode included in the organic light emitting diode display module, and reflected light will directly penetrate through the color filter, which will increase reflectivity of the ambient light and reduce contrast of the organic light emitting diode display module.

An embodiment of the present disclosure provides an organic electroluminescent display module, which can improve contrast of an organic light emitting diode display module and light transmittance of the organic light emitting diode display module.

The technical solutions of the present disclosure will now be described in detail through exemplary embodiments.

Figure 1:
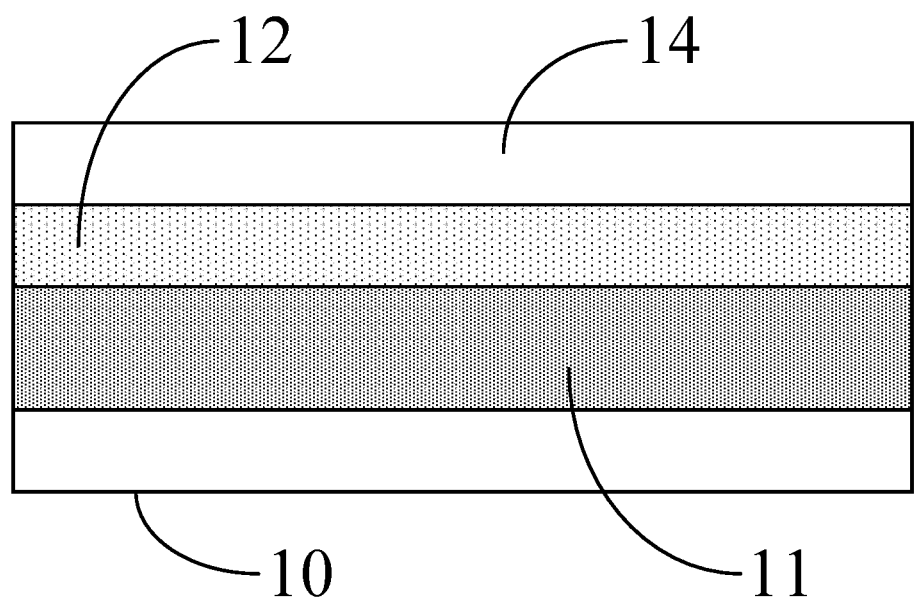
FIG. 1 is a schematic diagram of a structure of an organic electroluminescent display module according to an embodiment of the present disclosure.
Figure 2A:
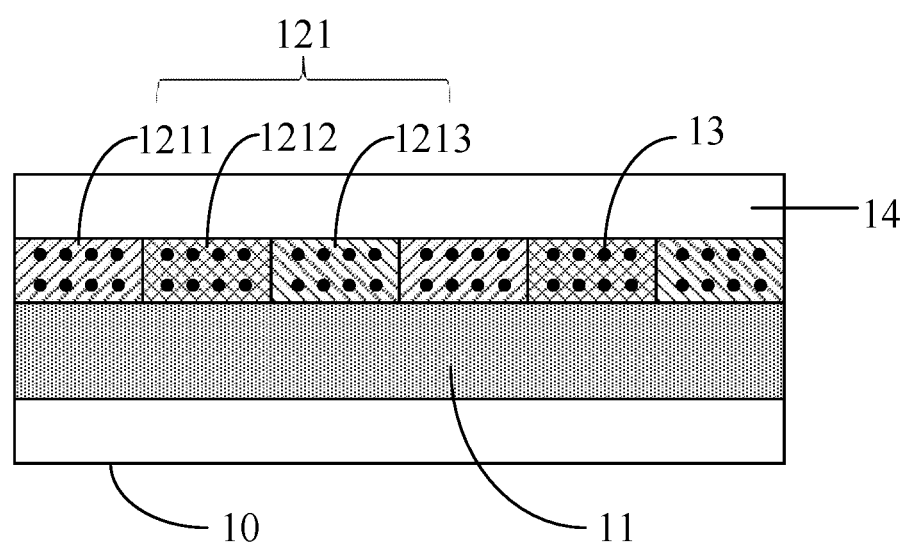
FIG. 2a is a schematic diagram of a structure of a modified color filtering layer included in an organic electroluminescent display module according to an embodiment of the present disclosure.
Figure 2B:
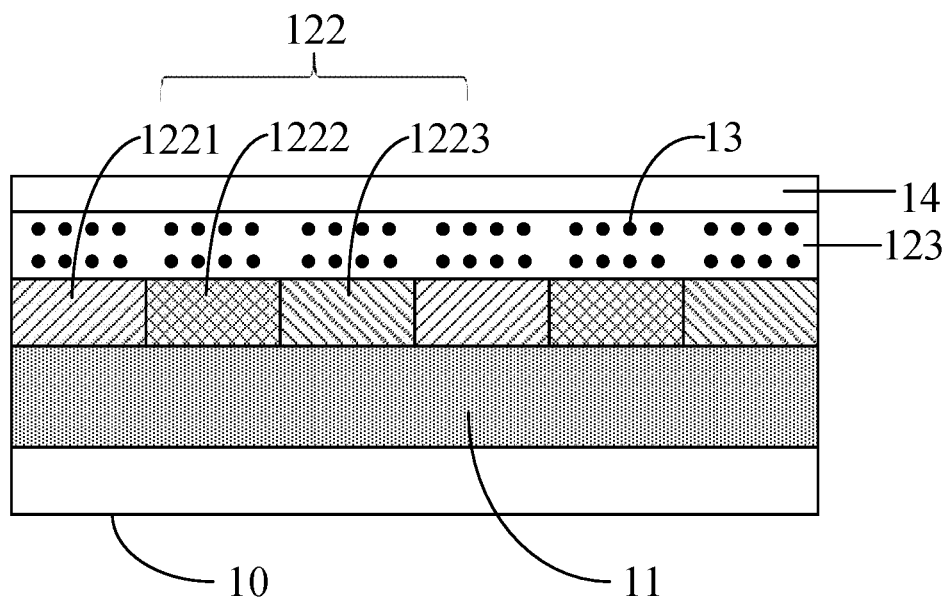
FIG. 2b is a schematic diagram of a structure of a color filtering layer and a modified optically transparent adhesive layer included in an organic electroluminescent display module according to an embodiment of the present disclosure.

In a first aspect, an embodiment of the present disclosure provides an organic electroluminescent display module, as shown in FIGS. 1, 2a and 2b. The organic electroluminescent display module includes a base substrate 10, an organic electroluminescent device 11, and a light absorption layer 12.

The organic electroluminescent device 11 is located on the base substrate 10, and the light absorption layer 12 is located on a side of the organic electroluminescent device 11 away from the base substrate 10.

The light absorption layer 12 includes a modified color filtering layer 121, or includes a color filtering layer 122 and a modified optically transparent adhesive layer 123 located on a side of the color filtering layer 122.

The modified color filtering layer 121 includes at least a red modified layer 1211, a green modified layer 1212, and a blue modified layer 1213. The red modified layer 1211 is disposed at a position where a red sub-pixel needs to be formed, the green modified layer 1212 is disposed at a position where a green sub-pixel needs to be formed, and the blue modified layer 1213 is disposed at a position where a blue sub-pixel needs to be formed. The red modified layer 1211, the green modified layer 1212, and the blue modified layer 1213 are each provided with nanoparticles 13 configured to absorb ambient light.

The color filtering layer 122 at least includes the red filtering layer 1221, the green filtering layer 1222 and the blue filtering layer 1223. The red filtering layer 1221 is disposed at a position where a red sub-pixel needs to be formed, the green filtering layer 1222 is disposed at a position where a green sub-pixel needs to be formed, and the blue filtering layer 1223 is disposed at a position where a blue sub-pixel needs to be formed. The modified optically transparent adhesive layer 123 is provided with nanoparticles 13 configured to absorb ambient light.

In an embodiment of the present disclosure, the organic electroluminescent display module further includes a cover plate 14, wherein the cover plate 14 may be a glass substrate. In an embodiment of the present disclosure, the organic electroluminescent device 11 may include a thin film transistor array driving circuit, an organic functional layer, and an encapsulation layer. The organic functional layer may include a hole transport layer, a hole injection layer, an electron transport layer, an electron injection layer, and an organic light emitting layer. The encapsulation layer may include an organic encapsulation layer and an inorganic encapsulation layer disposed in a stacked manner. The structural design of the organic electroluminescent device 11 is not described in detail.

In an embodiment of the present disclosure, the modified color filtering layer 121 is formed by adding nanoparticles into the color filter. The nanoparticles in the embodiment of the present disclosure may be directly added into the color filter without additional preparation process. The color filter includes a red filter, a green filter and a blue filter. The red modified layer 1211 in the embodiment of the present disclosure is formed by adding the nanoparticles into the red filter, the green modified layer 1212 in the embodiment of the present disclosure is formed by adding the nanoparticles into the green filter, and the blue modified layer 1213 in the embodiment of the present disclosure is formed by adding the nanoparticles into the blue filter. Compared with a circular polarizer, the modified color filtering layer 121 the an embodiment of the present disclosure can not only increase an extraction amount of light emitted by the organic electroluminescent device but also reduce the reflection of the ambient light.

The organic electroluminescent display module according to the embodiment of the present disclosure includes the light absorption layer 12. The light absorption layer 12 includes the modified color filtering layer 121, or includes the color filtering layer 122 and the modified optically transparent adhesive layer 123 located on a side of the color filtering layer 122. When the modified color filtering layer 121 in the embodiment of the present disclosure is used instead of the circular polarizer, since the modified color filtering layer 121 at least includes the red modified layer 1211, the green modified layer 1212, and the blue modified layer 1213, and each of the red modified layer 1211, the green modified layer 1212 and the blue modified layer 1213 is provided with the nanoparticles 13 configured to absorb the ambient light, the organic electroluminescence display module in the embodiment of the present disclosure can achieve higher light transmittance and lower reflectivity for surface light, thereby the contrast ratio of the organic electroluminescence display module can be improved. In addition, when the color filtering layer 122 and the modified optically transparent adhesive layer 123 in the embodiment of the present disclosure are used instead of the circular polarizer, since the color filtering layer 122 at least includes the red filtering layer 1221, the green filtering layer 1222 and the blue filtering layer 1223, and the modified optically transparent adhesive layer 123 is provided with the nanoparticles 13 configured to absorb the ambient light, the organic electroluminescent display module in the embodiment of the present disclosure can achieve higher light transmittance and lower reflectivity for surface light, thereby the contrast ratio of the organic electroluminescent display module is improved. The modified optically transparent adhesive layer 123 may be disposed on a side of the color filtering layer 122 away from the organic electroluminescent device 11 and embodiments of the present disclosure are not limited thereto.

Taking an organic light emitting diode display device as an example of the organic electroluminescent device in the embodiment of the present disclosure, the embodiment of the present disclosure may be applied to any one or more of an actively driven organic light emitting diode display device, a passively driven organic light emitting diode display device, a rigid organic light emitting diode display device, and a flexible organic light emitting diode display device.

In an optional embodiment, photoluminescent materials are included in the red modified layer 1211, the green modified layer 1212, and the blue modified layer 1213 in an embodiment of the present disclosure. The organic electroluminescent device 11 includes an organic light emitting layer, wherein the organic light emitting layer includes a blue organic light emitting layer or includes an ultraviolet organic light emitting layer. Optionally, the photoluminescent material in the embodiment of the present disclosure may be a quantum dot (having a particle size less than 10 nm) light emitting material, and under excitation of ultraviolet light or blue light, the material may emit green light and red light. In this case, in an embodiment of the present disclosure, when manufacturing the organic light emitting layer, it is only required to evaporate a blue organic light emitting material or a ultraviolet organic light emitting material without using a fine metal mask, thereby the process difficulty is reduced and the evaporation yield of organic light emitting materials is improved.

In an exemplary embodiment, an addition amount of the photoluminescent material may be related to one or more of the following factors: light emitting efficiency of the photoluminescent material itself, color coordinate, color coordinate of white light, luminance of the blue organic light emitting layer, luminance of an ultraviolet organic emitting layer and the like, and influences of these factors may be comprehensively considered in case of actual addition, and a better addition amount may be obtained through experiments. Of course, in practical applications, the red modified layer 1211, the green modified layer 1212 and the blue modified layer 1213 may not contain a photoluminescent material.

In an embodiment of the present disclosure, light emitted by the organic light emitting layer may be used as a basic light source, and according to actual setting of the basic light source, the red modified layer 1211, the green modified layer 1212, and the blue modified layer 1213 are selectively configured as to whether the photoluminescent material is contained. For example, in an embodiment of the present disclosure, light emitted by red, green and blue organic light emitting materials may be used as the basic light source, respectively, and in this case, the red modified layer 1211, the green modified layer 1212 and the blue modified layer 1213 may not contain the photoluminescent material. Of course, in other exemplary embodiments, white light formed by the three organic light emitting materials of red, green and blue in combination may be used as the basic light source, and in this case, the red modified layer 1211, the green modified layer 1212 and the blue modified layer 1213 may not contain the photoluminescent material. Optionally, only light emitted by the ultraviolet organic light emitting material may be used as the basic light source, and in this case, each of the red modified layer 1211, the green modified layer 1212, and the blue modified layer 1213 contains the photoluminescent material. Optionally, only light emitted by the blue organic light emitting material may be used as the basic light source, and in this case, both the red modified layer 1211 and the green modified layer 1212 contain the photoluminescent material, and the blue modified layer 1213 may not contain the photoluminescent material.

Figure 3A:
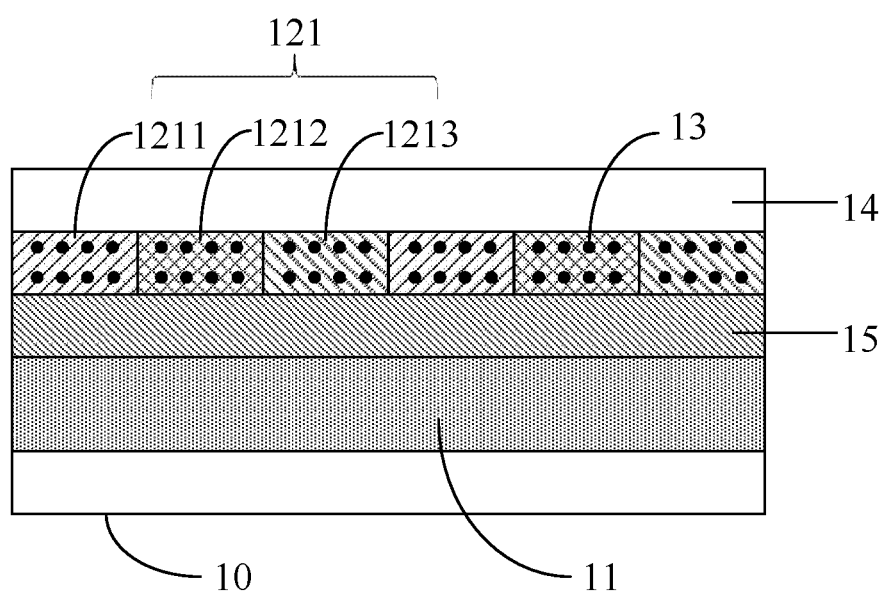
FIGS. 3a-3d are schematic diagrams of structures of a modified color filtering layer and a touch structure included in an organic electroluminescent display module according to an embodiment of the present disclosure.
Figure 3B:
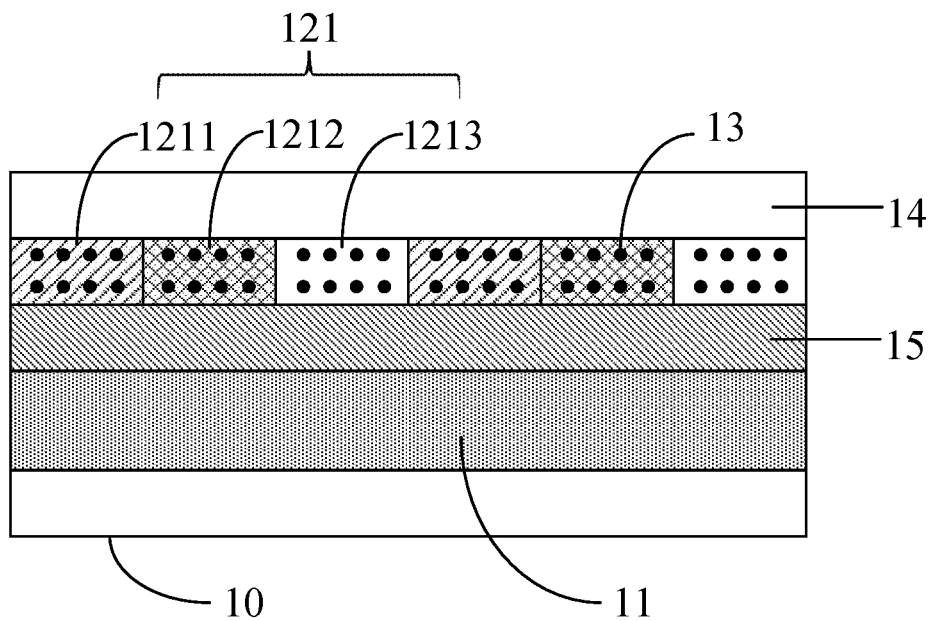
Figure 3C:
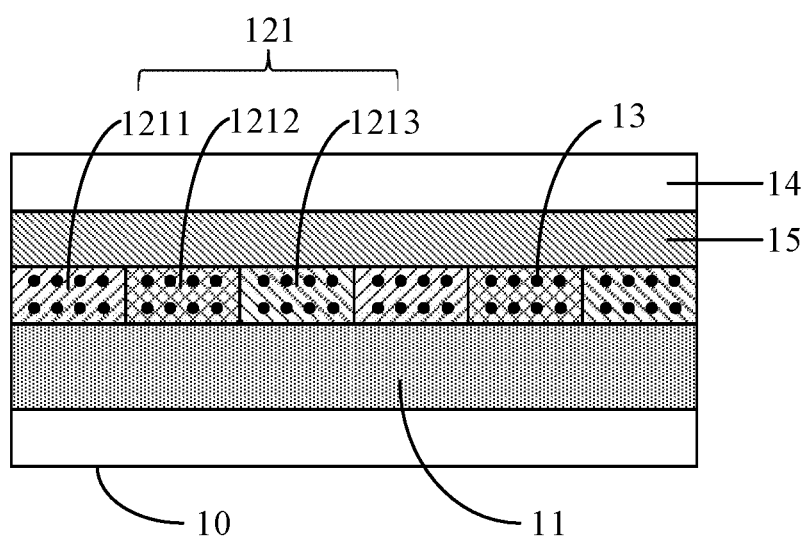
Figure 3D:
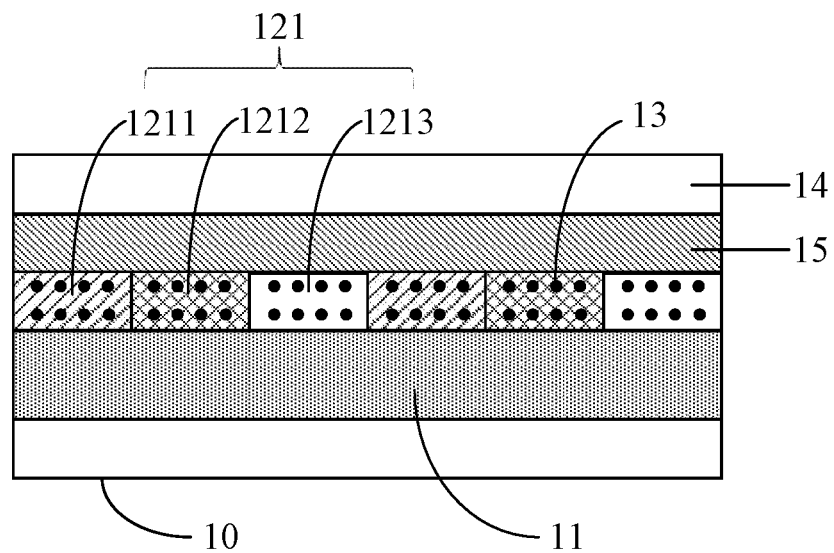

Optionally, in an embodiment of the present disclosure, the organic electroluminescent display module further includes a touch structure 15, as shown in FIGS. 3*a* and 3*b*. The touch structure 15 may be located on a side of the modified color filtering layer 121 close to the organic electroluminescent device 11. Or, as shown in FIGS. 3*c* and 3*d*, the touch structure 15 is located on a side of the modified color filtering layer 121 away from the organic electroluminescent device 11. The addition of the touch structure 15 enables the organic electroluminescent display module to have a touch control function, which can better meet needs of users, and configurations of the touch structure are not described in detail.

Embodiments of the present disclosure may be applied to external-hanging color filters. Optionally, as shown in FIGS. 3*a* and 3*b*, in actual manufacturing, the modified color filtering layer 121 may be manufactured on the cover plate 14 and attached to a side of the touch structure 15 away from the organic electroluminescent device 11 through an optically transparent adhesive; or, they may be applied to integrated color filters, as shown in FIGS. 3*c* and 3*d*, and in actual manufacturing, the modified color filtering layer 121 may be directly manufactured on the organic electroluminescent device 11. The manner in which the modified color filtering layer 121 is directly manufactured on the organic electroluminescent device 11 can reduce the thickness of the organic electroluminescent display module and be more suitable for bending or even folding applications as compared to the conventional polarizer.

In FIGS. 3*a* and 3*c*, each of the red modified layer 1211, the green modified layer 1212, and the blue modified layer 1213 contains the photoluminescent material (the material is not shown in the figures), and in this case, the light emitted by the ultraviolet organic light emitting material may be used as the basic light source. In FIGS. 3b and 3d, both the red modified layer 1211 and the green modified layer 1212 contain the photoluminescence material, and the blue modified layer 1213 does not contain the photoluminescence material, and in this case, the light emitted by the blue organic luminescence material may be used as the basic light source. In an embodiment of the present disclosure, in a case that the light emitted by the ultraviolet organic light emitting material or the light emitted by the blue organic light emitting material is used as the basic light source, and when manufacturing the organic light emitting layer, it is only required to evaporate the ultraviolet organic light emitting material or the blue organic light emitting material without using a fine metal mask, thus the process difficulty is reduced and the evaporation yield of the organic light emitting materials is improved.

Figure 4A:
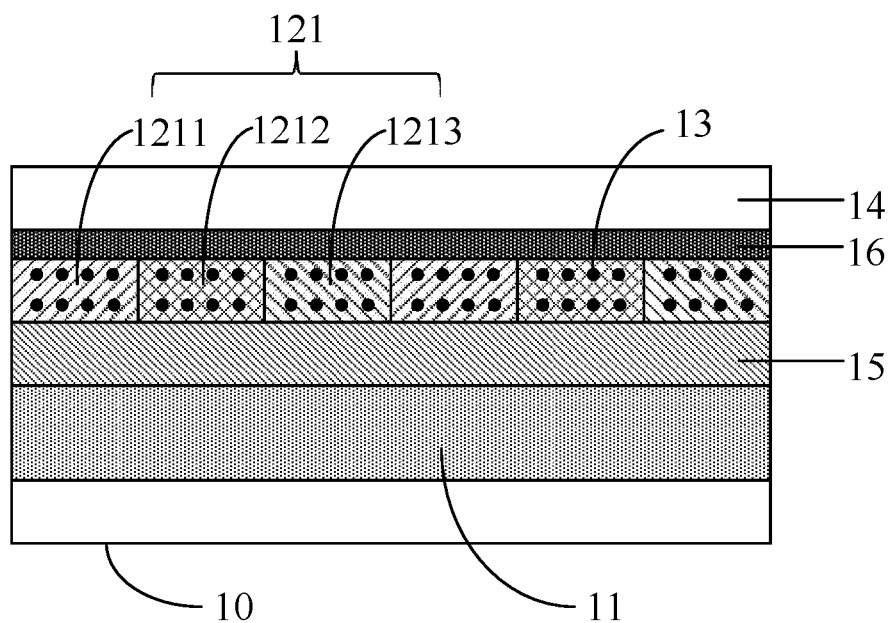
FIGS. 4a-4d are schematic diagrams of structures of a modified color filtering layer, a touch structure and an antireflection film included in an organic electroluminescent display module according to an embodiment of the present disclosure.
Figure 4B:
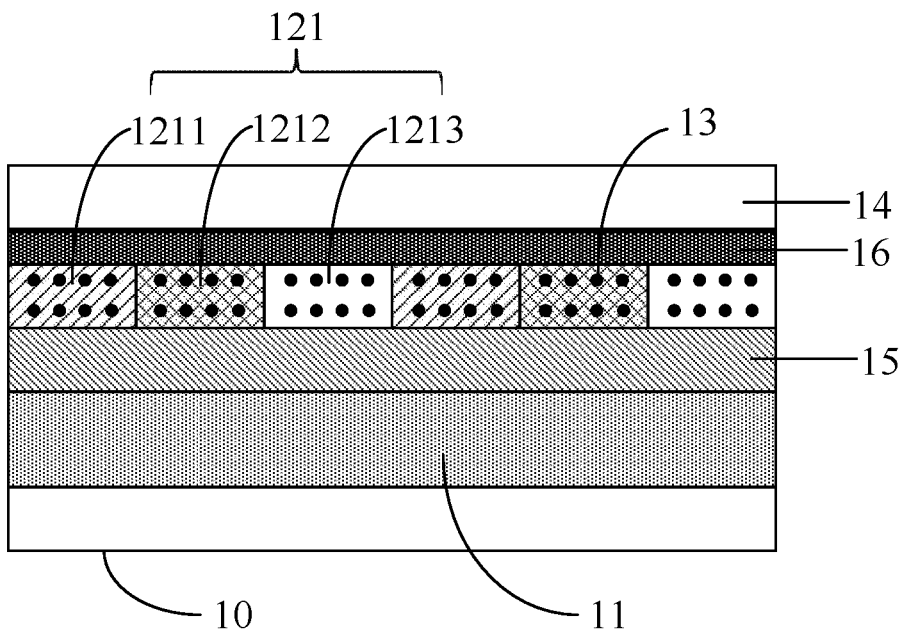
Figure 4C:
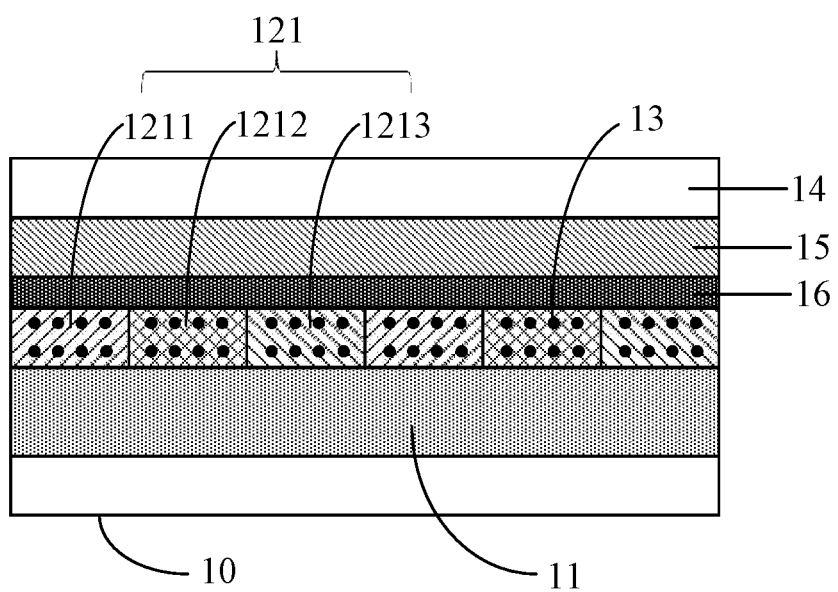
Figure 4D:
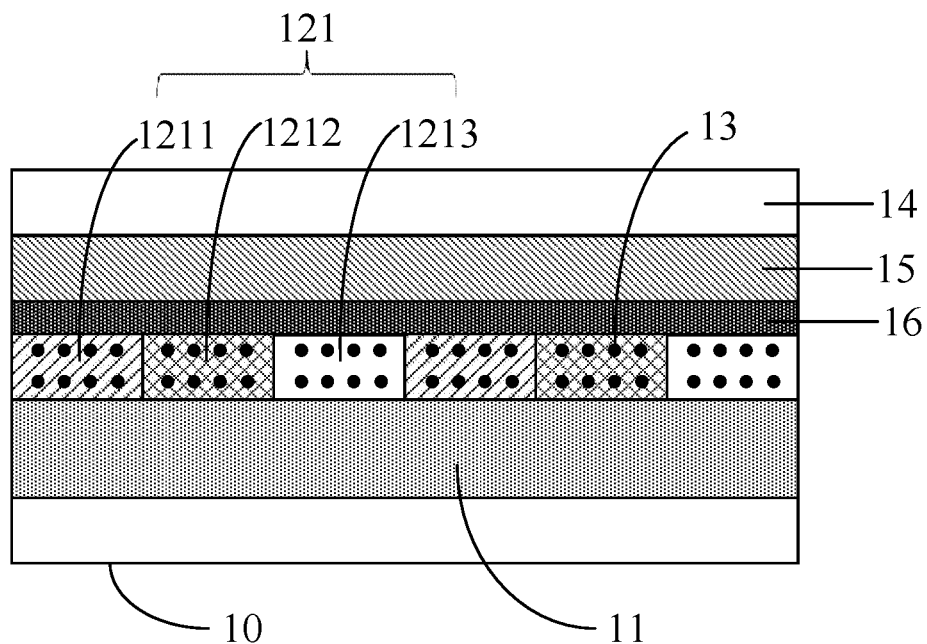

Optionally, as shown in FIGS. 4a, 4b, 4c and 4d, in an embodiment of the present disclosure, the light absorption layer 12 further includes an antireflection film 16 configured to absorb ambient light. The antireflection film 16 may be located on a side of the modified color filtering layer 121 away from the touch structure 15, as shown in FIGS. 4a and 4b. Optionally, the antireflection film 16 may be located between the modified color filtering layer 121 and the touch structure 15, as shown in FIGS. 4c and 4d. Arrangement of the antireflection film 16 can reduce the reflection of ambient light so that the contrast ratio of the organic electroluminescent display module can be further improved.

Optionally, in an embodiment of the present disclosure, the red modified layer 1211, the green modified layer 1212, and the blue modified layer 1213 are provided with nanoparticles of a same material. Or, the red modified layer 1211 is provided with nanoparticles of a first material, the green modified layer 1212 is provided with nanoparticles of a second material, and the blue modified layer 1213 is provided with nanoparticles of a third material. The nanoparticles of the first material may be used for absorbing light with a wavelength of 650 nm or more in the ambient light, the nanoparticles of the second material may be used for absorbing light with a wavelength of 500 nm or less in the ambient light, and the nanoparticles of the third material may be used for absorbing light with a wavelength of 410 nm or less in the ambient light. In an embodiment of the present disclosure, when the color filter is modified by using nanoparticles, the nanoparticles are added before the material of the color filtering layer is coated, and mechanical/electromagnetic/ultrasonic stirring is carried out during the adding, so that the nanoparticles may be uniformly distributed in the red modified layer 1211, the green modified layer 1212 and the blue modified layer 1213 formed by modification.

In an exemplary embodiment, nanoparticle materials used may include, but are not limited to, one of or a combinations of: silver oxide (AgOx), copper oxide (CuOx), zinc oxide (ZnOx), cobalt oxide (CoOx), nickel oxide (NiOx), iron oxide (FeOx), lanthanum oxide (LaOx), tungsten oxide (WOx), titanium oxide (TiOx), zirconium oxide (ZrOx), tin oxide (SnOx), indium oxide (InOx), gallium oxide (GaOx), germanium oxide (GeOx), tantalum oxide (TaOx), aluminum oxide (AlOx), silicon nitride (SiNx), silicon carbide (SiC), terbium sulfide (TbSx), gadolinium sulfide (GdSx), cadmium sulfide (CdS), cadmium selenide (CdSe), indium phosphide (InP), arsenic sulfide (AsSx), lead sulfide (PbS), perovskite oxide, graphene, carbon nanotubes and the like, or a material composed of one or more of the above materials may be used. A mass percentage of the added nanoparticles may range from 0.01% to 20%, and diameters of the nanoparticles may range from 0.1 nm to 200 nm.

In an exemplary embodiment, in order to adjust an absorption spectrum of the nanoparticles, other materials may be doped into the above nanoparticle materials. Materials for doping include but not limited to one or more of molybdenum (Mo), aluminum (Al), silver (Ag), gold (Au), copper (Cu), iron (Fe), gallium (Ga), germanium (Ge), tungsten (W), titanium (Ti), zirconium (Zr), tin (Sn), tantalum (Ta), vanadium (V), nickel (Ni), cobalt (Co), indium (In), platinum (Pt), lead (Pb), lanthanide metals, rare earth elements, carbon (C), nitrogen (N), fluorine (F), chlorine (Cl) and sulfur (S). For example, molybdenum (Mo) or silver (Ag) may be doped into silicon oxide (SiOx), so that it can strongly absorb light with the wavelength of 650 nm or more.

Optionally, in an embodiment of the present disclosure, the nanoparticles of the first material disposed in the red modified layer 1211 may be molybdenum-doped silicon oxide or silver-doped silicon oxide, so as to be able to absorb light with the wavelength of 650 nm or more in the ambient light. The nanoparticles of the second material disposed in the green modified layer 1212 may be terbium sulfide (TbSx) so as to be able to absorb light with the wavelength of 500 nm or less in the ambient light. The nanoparticles of the third material disposed in the blue modified layer 1213 may be titanium oxide (TiOx) so as to be able to absorb light with the wavelength of 410 nm or less in the ambient light.

In another optional embodiment, in in the embodiment of the present disclosure, each of the red filtering layer 1221, the green filtering layer 1222, and the blue filtering layer 1223 is provided with the photoluminescent material. The organic electroluminescent device includes the organic light emitting layer, wherein the organic light emitting layer includes the blue organic light emitting layer or includes the ultraviolet organic light emitting layer. Optionally, the photoluminescent material in the embodiment of the present disclosure may be the quantum dot (having a particle size less than 10 nm) light emitting material, and under excitation of the ultraviolet light or blue light, the material may emit green light and red light. Therefore, in the embodiment of the present disclosure, when manufacturing the organic light emitting layer, it is only required to evaporate the blue organic light emitting material or the ultraviolet organic light emitting material without using the fine metal mask, thereby the process difficulty is reduced and the evaporation yield of the organic light emitting materials is improved. In practical applications, the red modified layer 1211, the green modified layer 1212 and the blue modified layer 1213 may not contain the photoluminescent material either.

Figure 5A:
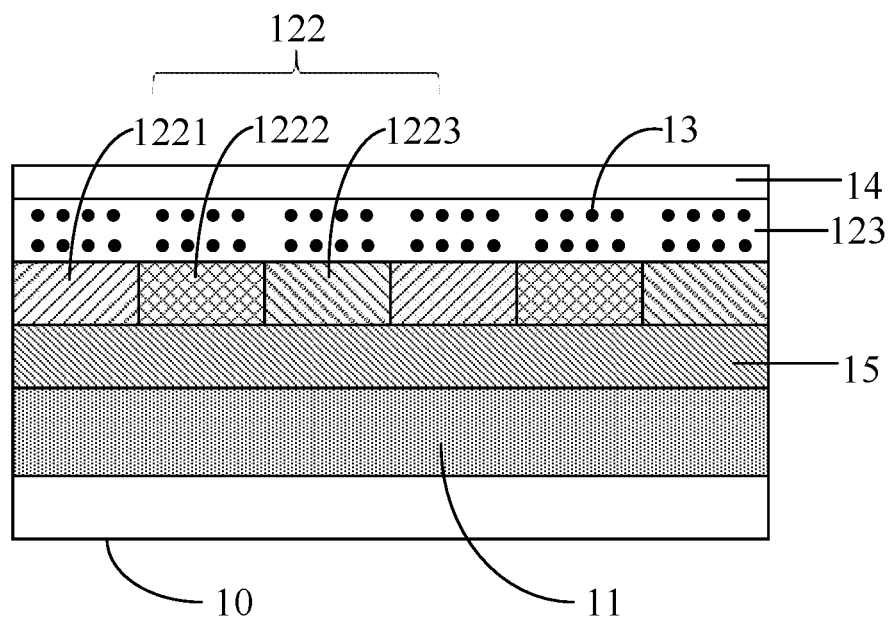
Figure 5B:
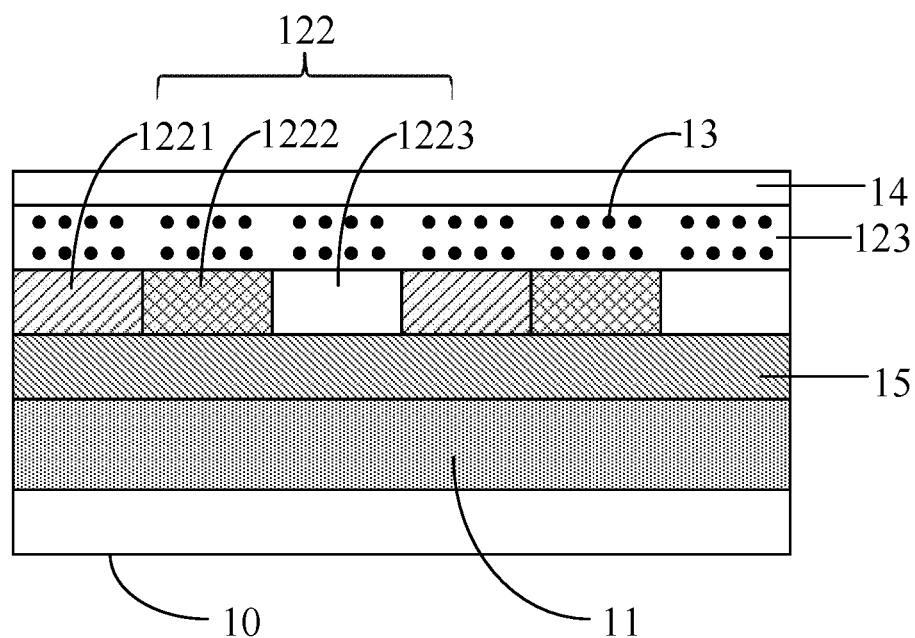
Figure 5C:
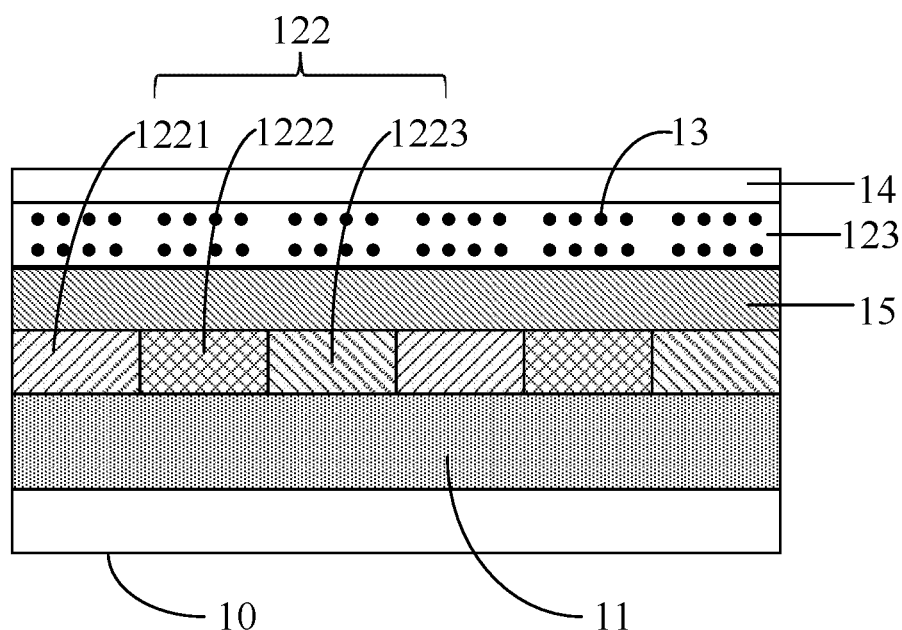
Figure 5D:
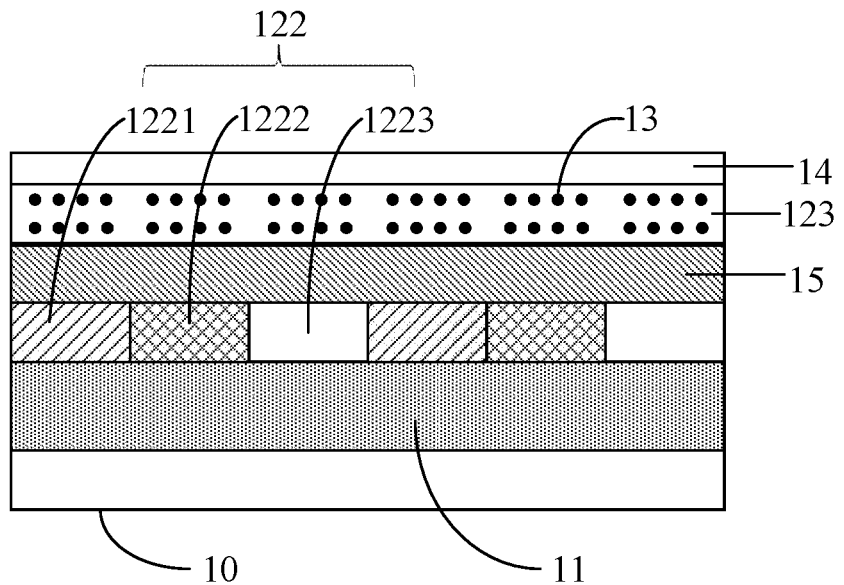
Figure 5E:
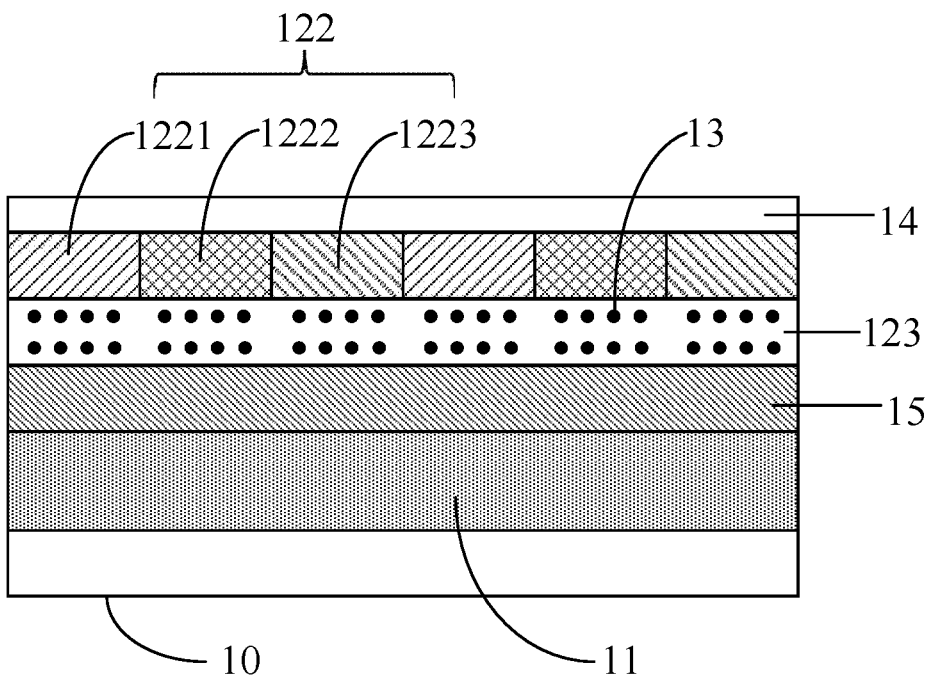
Figure 5F:
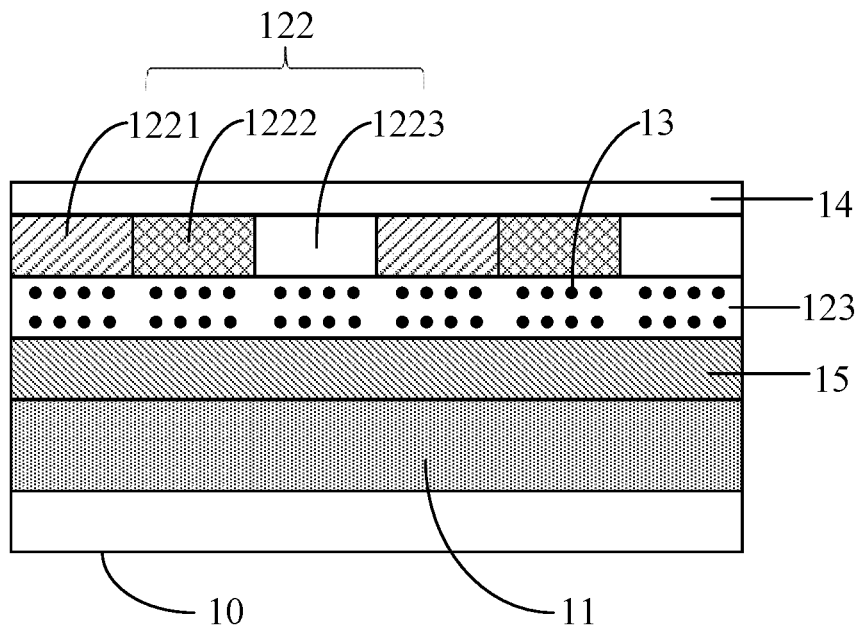
Figure 5G:
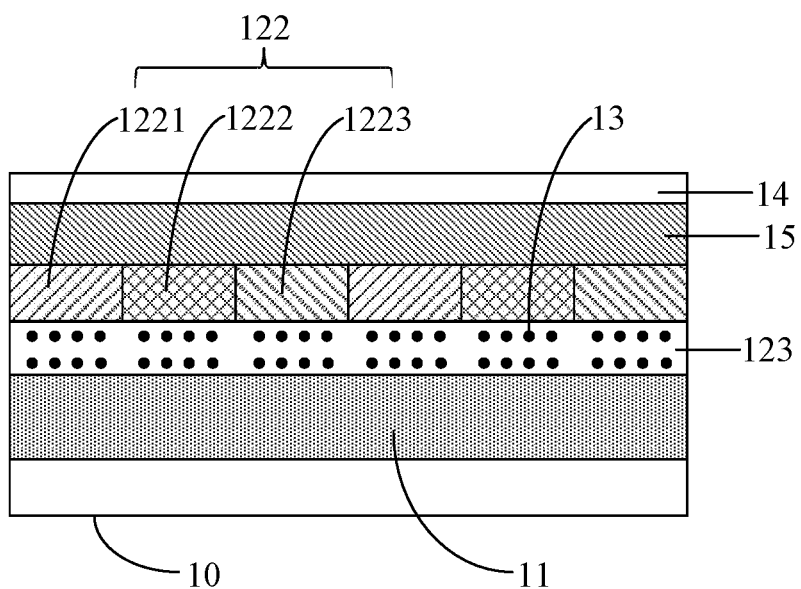
Figure 5H:
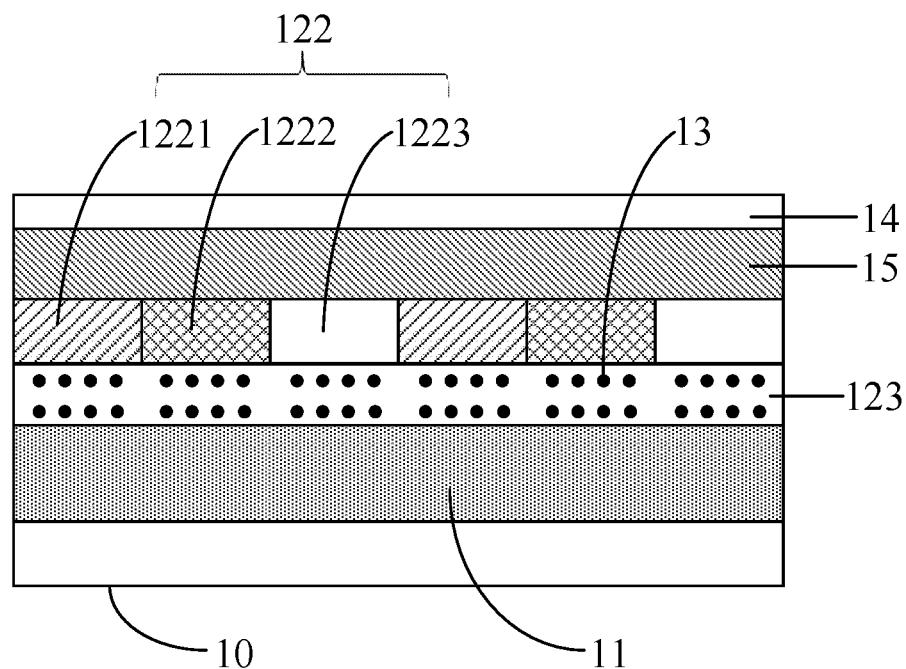
Figure 5I:
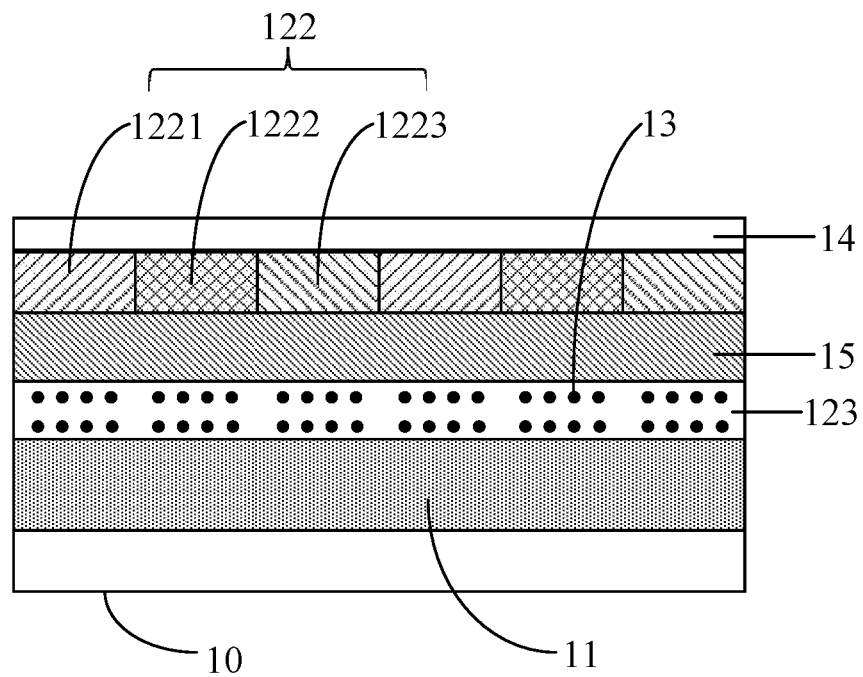
Figure 5J:
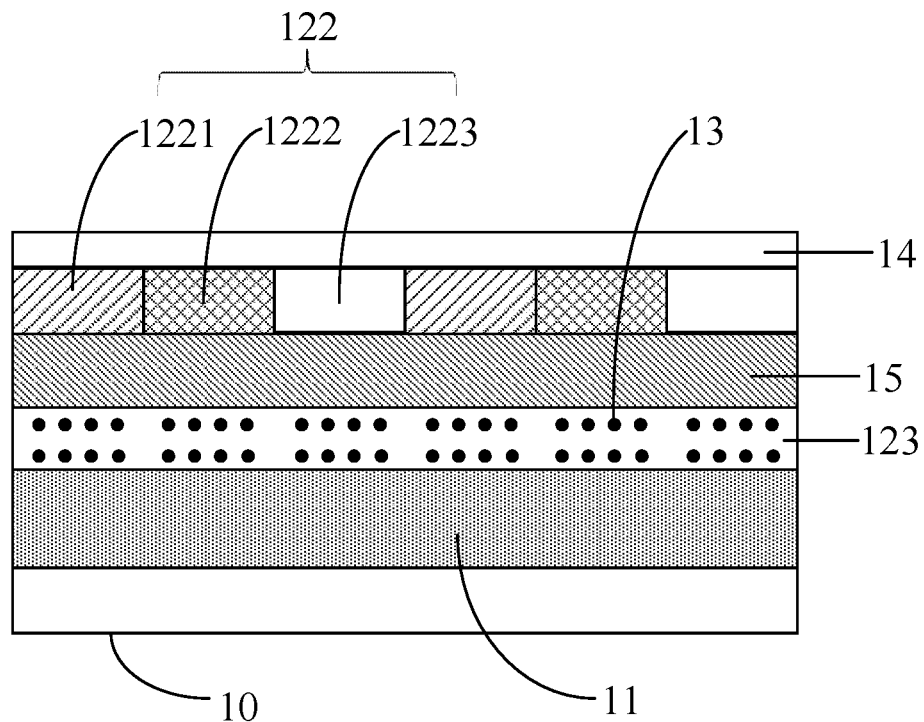
Figure 5K:
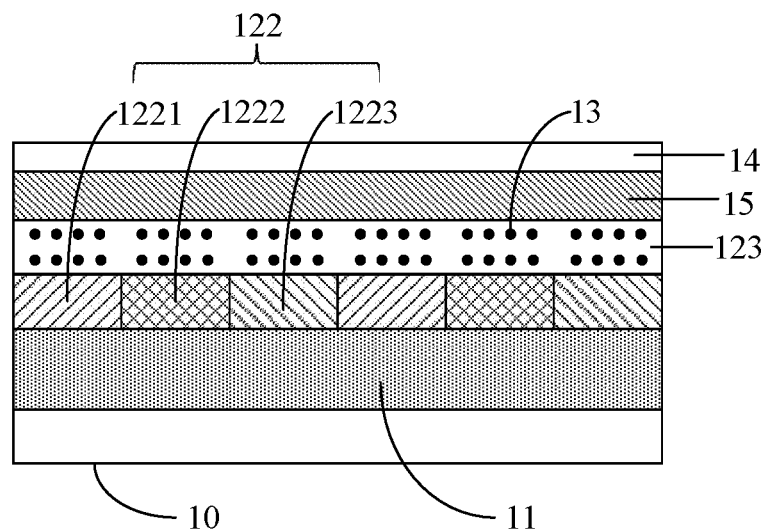
Figure 51:
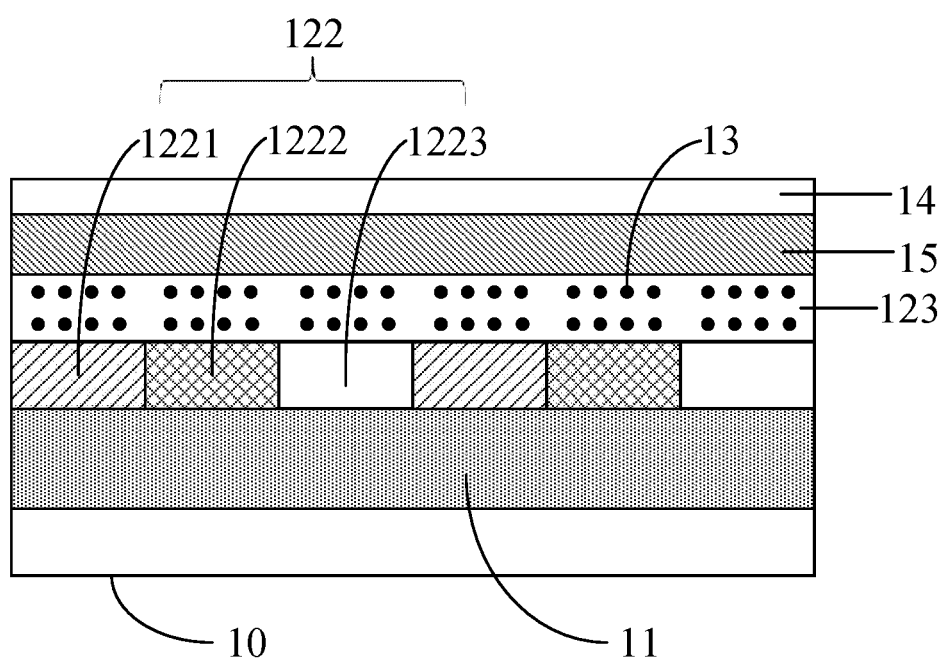

Optionally, in an embodiment of the present disclosure, the organic electroluminescent display module further includes the touch structure 15, as shown in FIGS. 5a and 5b. The modified optically transparent adhesive layer 123 is located on a side of the color filtering layer 122 away from the organic electroluminescent device 11, and the touch structure 15 is located on a side of the color filtering layer 122 close to the organic electroluminescent device 11. Or, as shown in FIGS. 5c and 5d, the modified optically transparent adhesive layer 123 is located on the side of the color filtering layer 122 away from the organic electroluminescent device 11, and the touch structure 15 is located between the color filtering layer 122 and the modified optically transparent adhesive layer 123. Or, as shown in FIGS. 5e and 5f, the modified optically transparent adhesive layer 123 is located on the side of the color filtering layer 122 close to the organic electroluminescent device 11, and the touch structure 15 is located on a side of the modified optically transparent adhesive layer 123 close to the organic electroluminescent device 11. Or, as shown in FIGS. 5g and 5h, the modified optically transparent adhesive layer 123 is located on the side of the color filtering layer 122 close to the organic electroluminescent device 11, and the touch structure 15 is located on the side of the color filtering layer 122 away from the organic electroluminescent device 11. Or, as shown in FIGS. 5i and 5j, the modified optically transparent adhesive layer 123 is located on the side of the color filtering layer 122 close to the organic electroluminescent device 11, and the touch structure 15 is located between the color filtering layer 122 and the modified optically transparent adhesive layer 123. Or, as shown in FIGS. 5k and 5l, the modified optically transparent adhesive layer 123 is located on the side of the color filtering layer 122 away from the organic electroluminescent device 11, and the touch structure 15 is located on a side of the modified optically transparent adhesive layer 123 away from the color filtering layer 122. The addition of the touch structure 15 enables the organic electroluminescent display module to have a touch control function, which can better meet needs of users, and configurations of the touch structure are not described in detail.

In an embodiment of the present disclosure, the modified optically transparent adhesive layer 123 is formed by adding nanoparticles into an optically transparent adhesive. Since the color filtering layer 122 in the embodiment of the present disclosure has a certain light absorption itself, concentration of the nanoparticles added into the optically transparent adhesive is not very high, and thus, an influence on the displaying of the organic electroluminescent display module is small.

Embodiments of the present disclosure may be applied to external-hanging color filters. For example, as shown in FIGS. 5a, 5b, 5e, 5f, 5g, 5h, 5i and 5j, in manufacturing, the color filtering layer 122 may be manufactured on the cover plate 14, and attached to a side of the touch structure 15 away from the organic electroluminescent device 11 by the optically transparent adhesive; or the color filtering layer 122 is manufactured on the cover plate 14, and attached to the side of the touch structure 15 away from the organic electroluminescent device 11 by the modified optically transparent adhesive layer 123; or the color filtering layer 122 is manufactured on the cover plate 14 and attached to a side of the organic electroluminescent device 11 away from the base substrate 10 by the modified optically transparent adhesive layer 123; or, the color filtering layer 122 is manufactured on the cover plate 14 and attached to a side of the touch structure 15 away from the modified optically transparent adhesive layer 123 by the optically transparent adhesive. Embodiments of the present disclosure may also be applied to integrated color filters, as shown in FIG. 5c, FIG. 5d, FIG. 5k and FIG. 5l. In actual manufacturing, the color filtering layer 122 may be directly manufactured on the organic electroluminescent device 11, and the color filtering layer 122 may be directly manufactured on the organic electroluminescent device 11, which can reduce a thickness of the organic electroluminescent display module and make it more suitable for applications in fields of bending or even folding as compared with conventional polarizers.

In FIGS. 5a, 5c, 5e, 5g, 5i, and 5k, each of the red filtering layer 1221, the green filtering layer 1222, and the blue filtering layer 1223 contains the photoluminescent material (the material is not shown in the drawings), and in this case, the light emitted by the ultraviolet organic light emitting material may be used as the basic light source. In FIG. 5b, FIG. 5d, FIG. 5f, FIG. 5h, FIG. 5j, and FIG. 5l, both the red filtering layer 1221 and the green filtering layer 1222 contain the photoluminescent material (the material is not shown in the drawings), and the blue filtering layer 1223 does not contain the photoluminescent material, and in this case, the light emitted by the blue organic light emitting material may be used as the basic light source. In an embodiment of the present disclosure, when the light emitted by the ultraviolet organic light emitting material or the light emitted by the blue organic light emitting material is used as the basic light source, and when manufacturing the organic light emitting layer, it is only necessary to evaporate the ultraviolet organic light emitting material or the blue organic light emitting material without using the fine metal mask, thereby the process difficulty is reduced and the evaporation yield of the organic light emitting materials is improved.

Optionally, in an embodiment of the present disclosure, the light absorption layer 12 may further include the anti-reflection film configured to absorb the ambient light. The antireflection film may be located between the color filtering layer 122 and the modified optically transparent adhesive layer 123; or, the antireflection film may be located on a side of the modified optically transparent adhesive layer 123 away from the color filtering layer 122; or, the antireflection film may be located on a side of the color filtering layer 122 away from the modified optically transparent adhesive layer 123. Arrangement of the antireflection film, can further reduce reflection of ambient light, thereby the contrast ratio of the organic electroluminescent display module can be further improved.

In an optional embodiment, the modified optically transparent adhesive layer 123 of the embodiment of the present disclosure may be provided with nanoparticles of a same material. The nanoparticles are uniformly distributed in the modified optically transparent adhesive layer 123. The optically transparent adhesive may be in the form of solid (Optical Clear Adhesive, OCA) or liquid (Optical Clear Resin, OCR), wherein if the optically transparent adhesive is in the form of OCA, the nanoparticles are added during the manufacturing of the OCA; and if the optically transparent adhesive is in the form of OCR, the nanoparticles are added before OCR coating, and mechanical/electromagnetic/ultrasonic stirring is needed during the adding to make the nanoparticles distribute evenly in the OCR. In the embodiment of the present disclosure, the nanoparticles may be directly added into the optically transparent adhesive without additional manufacturing process.

In an exemplary embodiment, the nanoparticle materials used may include but are not limited to one or more of AgOx, CuOx, ZnOx, CoOx, NiOx, FeOx, LaOx, WOx, TiOx, ZrOx, SnOx, InOx, GaOx, GeOx, TaOx, AlOx, SiNx, SiC, TbSx, GdSx, CdS, CdSx, InP, AsSx, PbS, perovskite oxides, graphene, carbon nanotubes and the like, or a material composed of one or more of the above materials may be employed. A mass percentage of the nanoparticles added may range from 0.01% to 20%, and diameters of the nanoparticles may range from 0.1 nm to 200 nm.

In an exemplary embodiment, in order to adjust an absorption spectrum of the nanoparticles, other materials may be doped into the above nanoparticle materials, which include but are not limited to one or more of Mo, Al, Ag, Au, Cu, Fe, Ga, Ge, W, Ti, Zr, Sn, Ta, V, Ni, Co, In, Pt, Pb, lanthanide metals, rare earth elements, C, N, F, Cl, S. For example, molybdenum (Mo) or silver (Ag) may be doped into silicon oxide (SiOx), so that it can strongly absorb light with the wavelength of 650 nm or more.

In another optional embodiment, the modified optically transparent adhesive layer 123 in the embodiment of the present disclosure may include a first sub-modified optically transparent adhesive layer, a second sub-modified optically transparent adhesive layer, and a third sub-modified optically transparent adhesive layer. Nanoparticles of a first material are disposed in the first sub-modified optically transparent adhesive layer, nanoparticles of a second material are disposed in the second sub-modified optically transparent adhesive layer, and nanoparticles of a third material are disposed in the third sub-modified optically transparent adhesive layer. A position of the first sub-modified optically transparent adhesive layer corresponds to a position of the red filtering layer, a position of the second sub-modified optically transparent adhesive layer corresponds to a position of the green filtering layer, and a position of the third sub-modified optically transparent adhesive layer corresponds to a position of the blue filtering layer. The nanoparticles of the first material are configured to absorb light with the wavelength of 650 nm or more in the ambient light, the nanoparticles of the second material are configured to absorb light with the wavelength of 500 nm or less in the ambient light, and the nanoparticles of the third material are configured to absorb light with the wavelength of 410 nm or less in the ambient light.

Optionally, in an embodiment of the present disclosure, the nanoparticles of the first material disposed in the first sub-modified optically transparent adhesive layer may be molybdenum-doped silicon oxide or silver-doped silicon oxide, so as to be able to absorb light with the wavelength of 650 nm or more in the ambient light. The nanoparticles of the second material disposed in the second sub-modified optically transparent adhesive layer may be terbium sulfide (TbSx), so as to be able to absorb light with the wavelength of 500 nm or less in the ambient light, and the nanoparticles of the third material disposed in the third sub-modified optically transparent adhesive layer may be titanium oxide (TiOx), so as to be able to absorb light with the wavelength of 410 nm or less in the ambient light.

In an exemplary embodiment, in an embodiment of the present disclosure, the first sub-modified optically transparent adhesive layer, the second sub-modified optically transparent adhesive layer and the third sub-modified optically transparent adhesive layer may be formed by a combination of distributed dripping and distributed curing. First, an optically transparent adhesive containing nanoparticles of molybdenum-doped silicon oxide or silver-doped silicon oxide may be dropped to the position corresponding to the position of the red filtering layer, and then a curing treatment is performed. Next, an optically transparent adhesive containing nanoparticles of terbium sulfide (TbSx) is dropped to the position corresponding to the position of the green filtering layer, and then a curing treatment is performed. Finally, an optically transparent adhesive containing nanoparticles of titanium oxide (TiOx) is dropped to the position corresponding to the position of the blue filtering layer, and then a curing treatment is performed.

Based on the same inventive concept, in a second aspect, an embodiment of the present disclosure further provides a display device including the organic electroluminescent display module of the first aspect. Since the display device includes the organic electroluminescent display module according to the first aspect of the embodiments of the present disclosure, the display device according to the embodiment of the present disclosure have the same beneficial effects as the organic electroluminescent display module, which are not described in detail herein.

Based on the same inventive concept, in a third aspect, an embodiment of the present disclosure further provides a method for preparing an organic electroluminescent display module. The organic electroluminescent display module includes a base substrate, an organic electroluminescent device and a light absorption layer. The preparation method includes steps of:
  forming the organic electroluminescent device on the base substrate, and forming the light absorption layer on a side of the organic electroluminescent device away from the base substrate, wherein:
  the light absorption layer includes a modified color filtering layer, or includes a color filtering layer and a modified optically transparent adhesive layer located on a side of the color filtering layer;
  the modified color filtering layer at least includes a red modified layer, a green modified layer and a blue modified layer; wherein the red modified layer is disposed at a position where a red sub-pixel needs to be formed, the green modified layer is disposed at a position where a green sub-pixel needs to be formed, and the blue modified layer is disposed at a position where a blue sub-pixel needs to be formed; the red modified layer, the green modified layer and the blue modified layer are all provided with nanoparticles configured to absorb ambient light; and
  the color filtering layer at least includes a red filtering layer, a green filtering layer and a blue filtering layer; wherein the red filtering layer is disposed at a position where a red sub-pixel needs to be formed, the green filtering layer is disposed at a position where a green sub-pixel needs to be formed, and the blue filtering layer is disposed at a position where a blue sub-pixel needs to be formed; the modified optically transparent adhesive layer is provided with the nanoparticles configured to absorb ambient light.

Use of the embodiments of the present disclosure can at least achieve the following beneficial effects.

First, since the organic electroluminescent display module according to the embodiments of the present disclosure includes the light absorption layer 12, the light absorption layer 12 includes the modified color filtering layer 121, or includes the color filtering layer 122 and the modified optically transparent adhesive layer 123 located on a side of the color filtering layer 122; when the modified color filtering layer 121 in the embodiments of the present disclosure is used instead of conventional circular polarizers, since the modified color filtering layer 121 at least includes the red modified layer 1211, the green modified layer 1212, and the blue modified layer 1213, and all of the red modified layer 1211, the green modified layer 1212 and the blue modified layer 1213 are provided with the nanoparticles 13 configured to absorb ambient light, so that the organic electroluminescence display module in the embodiments of the present disclosure can achieve higher light transmittance and lower reflectivity for surface light, thereby the contrast ratio of the organic electroluminescence display module can be improved. In addition, when the color filtering layer 122 and the modified optically transparent adhesive layer 123 in the embodiments of the present disclosure are used instead of the conventional circular polarizers, since the color filtering layer 122 at least includes the red filtering layer 1221, the green filtering layer 1222 and the blue filtering layer 1223, and the modified optically transparent adhesive layer 123 is provided with the nanoparticles 13 configured to absorb the ambient light, the organic electroluminescent display module in the embodiments of the present disclosure can achieve higher light transmittance and lower reflectivity for surface light, thereby the contrast ratio of the organic electroluminescent display module can be improved.

Second, in the embodiments of the present disclosure, the modified color filtering layer 121 or the color filtering layer 122 may be directly manufactured on the organic electroluminescent device 11. Directly manufacturing the modified color filtering layer 121 on the organic electroluminescent device 11 can reduce the thickness of the organic electroluminescent display module and make it more suitable for applications in fields of bending or even folding as compared with the conventional polarizers.

Thirdly, after the photoluminescence material is added into the modified color filtering layer 121 or the color filtering layer 122 in the embodiments of the present disclosure, during manufacturing of the organic light emitting layer, it is only necessary to evaporate the blue organic light emitting material or the ultraviolet organic light emitting material without using the fine metal mask, thereby the process difficulty is reduced and the evaporation yield of the organic light emitting materials is improved.

Terms "first" and "second" are only used for description and should not be construed as indicating or implying relative importance or implicitly indicating the number of indicated technical features. Therefore, a feature defined by "first" and "second" may explicitly or implicitly indicate inclusion of one or more such features. In the descriptions of the present disclosure, "multiple" means two or more than two, unless otherwise specified.

The above is only part of the implementations of the present disclosure, and it should be noted that for those of ordinary skills in the art, without departing from the principles of the present disclosure, various improvements and modifications may be made, and these improvements and modifications should also be regarded as being covered by the protection scope of the present disclosure.

The invention claimed is:

1. An organic electroluminescent display module comprising: a base substrate, an organic electroluminescent device, and a light absorption layer; wherein
   the organic electroluminescent device is located on the base substrate, and the light absorption layer is located on a side of the organic electroluminescent device away from the base substrate;
   the light absorption layer comprises a modified color filtering layer, or comprises a color filtering layer and a modified optically transparent adhesive layer located on a side of the color filtering layer;
   the modified color filtering layer at least comprises a red modified layer, a green modified layer and a blue modified layer; the red modified layer is provided at a position where a red sub-pixel needs to be formed, the green modified layer is provided at a position where a green sub-pixel needs to be formed, and the blue modified layer is provided at a position where a blue sub-pixel needs to be formed; each of the red modified layer, the green modified layer and the blue modified layer is provided therein with nanoparticles configured to absorb ambient light; and
   the color filtering layer at least comprises a red filtering layer, a green filtering layer and a blue filtering layer; the red filtering layer is provided at a position where a red sub-pixel needs to be formed, the green filtering layer is provided at a position where a green sub-pixel needs to be formed, and the blue filtering layer is provided at a position where a blue sub-pixel needs to be formed; the modified optically transparent adhesive layer is provided therein with the nanoparticles configured to absorb the ambient light;
   wherein the organic electroluminescent display module further comprises a touch structure; wherein
   the touch structure is located on a side of the modified color filtering layer close to the organic electroluminescent device; or,
   the touch structure is located on a side of the modified color filtering layer away from the organic electroluminescent device.

2. The organic electroluminescent display module according to claim 1, wherein each of the red modified layer, the green modified layer and the blue modified layer contains a photoluminescent material;
   the organic electroluminescent device comprises an organic light emitting layer, wherein the organic light emitting layer comprises a blue organic light emitting layer or an ultraviolet organic light emitting layer.

3. The organic electroluminescent display module according to claim 1, wherein
   the red modified layer, the green modified layer and the blue modified layer do not contain the photoluminescent material when light emitted by red, green and blue organic light emitting materials is used as a basic light source, respectively;
   none of the red modified layer, the green modified layer and the blue modified layer contain the photoluminescent material when white light formed by the red, green and blue organic light emitting materials in combination is used as the basic light source;
   each of the red modified layer, the green modified layer and the blue modified layer contains the photoluminescent material when only light emitted by an ultraviolet organic light emitting material is used as the basic light source; and
   both the red modified layer and the green modified layer contain the photoluminescent material and the blue modified layer does not contain the photoluminescent material when only light emitted by the blue organic light emitting material is used as the basic light source.

4. The organic electroluminescent display module according to claim 1, wherein the modified optically transparent adhesive layer is provided on a side of the color filtering layer away from the organic electroluminescent device.

5. The organic electroluminescent display module according to claim 1, wherein the light absorption layer further comprises an antireflection film configured to absorb the ambient light;
   the antireflection film is located on a side of the modified color filtering layer away from the touch structure; or,
   the antireflection film is located between the modified color filtering layer and the touch structure.

6. The organic electroluminescent display module according to claim 5, wherein the red modified layer, the green modified layer and the blue modified layer are provided therein with nanoparticles of a same material; or,
   the red modified layer is provided therein with nanoparticles of a first material, the green modified layer is provided therein with nanoparticles of a second material, and the blue modified layer is provided therein with nanoparticles of a third material.

7. The organic electroluminescent display module according to claim 6, wherein the nanoparticles of the first material are configured to absorb light with a wavelength of 650 nm or more in the ambient light, the nanoparticles of the second material are configured to absorb light with a wavelength of 500 nm or less in the ambient light, and the nanoparticles of the third material are configured to absorb light with a wavelength of 410 nm or less in the ambient light.

8. The organic electroluminescent display module according to claim 1, wherein
the modified optically transparent adhesive layer is located on a side of the color filtering layer away from the organic electroluminescent device, and the touch structure is located on a side of the color filtering layer close to the organic electroluminescent device; or,
the modified optically transparent adhesive layer is located on the side of the color filtering layer away from the organic electroluminescent device, and the touch structure is located between the color filtering layer and the modified optically transparent adhesive layer; or,
the modified optically transparent adhesive layer is located on the side of the color filtering layer close to the organic electroluminescent device, and the touch structure is located on a side of the modified optically transparent adhesive layer close to the organic electroluminescent device; or,
the modified optically transparent adhesive layer is located on the side of the color filtering layer close to the organic electroluminescent device, and the touch structure is located on the side of the color filtering layer away from the organic electroluminescent device; or,
the modified optically transparent adhesive layer is located on the side of the color filtering layer close to the organic electroluminescent device, and the touch structure is located between the color filtering layer and the modified optically transparent adhesive layer; or,
the modified optically transparent adhesive layer is located on the side of the color filtering layer away from the organic electroluminescent device, and the touch structure is located on a side of the modified optically transparent adhesive layer away from the color filtering layer.

9. The organic electroluminescent display module of claim 8, wherein the light absorption layer further comprises an antireflection film configured to absorb the ambient light;
the antireflection film is located between the color filtering layer and the modified optically transparent adhesive layer; or,
the antireflection film is located on the side of the modified optically transparent adhesive layer away from the color filtering layer; or,
the antireflection film is located on a side of the color filtering layer away from the modified optically transparent adhesive layer.

10. The organic electroluminescent display module according to claim 9, wherein the modified optically transparent adhesive layer is provided therein with nanoparticles of a same material; or,
the modified optically transparent adhesive layer comprises a first sub-modified optically transparent adhesive layer, a second sub-modified optically transparent adhesive layer and a third sub-modified optically transparent adhesive layer; the first sub-modified optically transparent adhesive layer is provided therein with nanoparticles of a first material, the second sub-modified optically transparent adhesive layer is provided therein with nanoparticles of a second material and the third sub-modified optically transparent adhesive layer is provided therein with nanoparticles of a third material;
a position of the first sub-modified optically transparent adhesive layer corresponds to a position of the red filtering layer, a position of the second sub-modified optically transparent adhesive layer corresponds to a position of the green filtering layer, and a position of the third sub-modified optically transparent adhesive layer corresponds to a position of the blue filtering layer.

11. The organic electroluminescent display module according to claim 10, wherein
the nanoparticles of the first material are configured to absorb light with a wavelength of 650 nm or more in the ambient light, the nanoparticles of the second material are configured to absorb light with a wavelength of 500 nm or less in the ambient light, and the nanoparticles of the third material are configured to absorb light with a wavelength of 410 nm or less in the ambient light.

12. A display device, comprising the organic electroluminescent display module according to claim 1.

13. A method for preparing an organic electroluminescent display module, the organic electroluminescent display module comprises: a base substrate, an organic electroluminescent device, and a light absorption layer, and the method comprises:
forming the organic electroluminescent device on the base substrate, and forming the light absorption layer on a side of the organic electroluminescent device away from the base substrate, wherein:
the light absorption layer comprises a modified color filtering layer, or comprises a color filtering layer and a modified optically transparent adhesive layer located on a side of the color filtering layer;
the modified color filtering layer at least comprises a red modified layer, a green modified layer and a blue modified layer; the red modified layer is provided at a position where a red sub-pixel needs to be formed, the green modified layer is provided at a position where a green sub-pixel needs to be formed, and the blue modified layer is provided at a position where a blue sub-pixel needs to be formed; the red modified layer, the green modified layer and the blue modified layer are each provided therein with nanoparticles configured to absorb ambient light;
the color filtering layer at least comprises a red filtering layer, a green filtering layer and a blue filtering layer; the red filtering layer is provided at a position where a red sub-pixel needs to be formed, the green filtering layer is provided at a position where a green sub-pixel needs to be formed, and the blue filtering layer is provided at a position where a blue sub-pixel needs to be formed; the modified optically transparent adhesive layer is provided therein with the nanoparticles configured to absorb the ambient light;
wherein the organic electroluminescent display module further comprises a touch structure; wherein
the touch structure is located on a side of the modified color filtering layer close to the organic electroluminescent device; or,
the touch structure is located on a side of the modified color filtering layer away from the organic electroluminescent device.

14. The organic electroluminescent display module according to claim 2, wherein the modified optically transparent adhesive layer is provided on a side of the color filtering layer away from the organic electroluminescent device.

15. The organic electroluminescent display module according to claim 3, wherein the modified optically transparent adhesive layer is provided on a side of the color filtering layer away from the organic electroluminescent device.

16. An organic electroluminescent display module comprising: a base substrate, an organic electroluminescent device, and a light absorption layer; wherein
the organic electroluminescent device is located on the base substrate, and the light absorption layer is located on a side of the organic electroluminescent device away from the base substrate;
the light absorption layer comprises a modified color filtering layer, or comprises a color filtering layer and a modified optically transparent adhesive layer located on a side of the color filtering layer;
the modified color filtering layer at least comprises a red modified layer, a green modified layer and a blue modified layer; the red modified layer is provided at a position where a red sub-pixel needs to be formed, the green modified layer is provided at a position where a green sub-pixel needs to be formed, and the blue modified layer is provided at a position where a blue sub-pixel needs to be formed; each of the red modified layer, the green modified layer and the blue modified layer is provided therein with nanoparticles configured to absorb ambient light; and
the color filtering layer at least comprises a red filtering layer, a green filtering layer and a blue filtering layer; the red filtering layer is provided at a position where a red sub-pixel needs to be formed, the green filtering layer is provided at a position where a green sub-pixel needs to be formed, and the blue filtering layer is provided at a position where a blue sub-pixel needs to be formed; the modified optically transparent adhesive layer is provided therein with the nanoparticles configured to absorb the ambient light;
wherein each of the red filtering layer, the green filtering layer and the blue filtering layer is provided therein with a photoluminescent material;
the organic electroluminescent device comprises an organic light emitting layer, wherein the organic light emitting layer comprises a blue organic light emitting layer or comprises an ultraviolet organic light emitting layer.

17. The organic electroluminescent display module according to claim 16, further comprising a touch structure; wherein
the modified optically transparent adhesive layer is located on a side of the color filtering layer away from the organic electroluminescent device, and the touch structure is located on a side of the color filtering layer close to the organic electroluminescent device; or,
the modified optically transparent adhesive layer is located on the side of the color filtering layer away from the organic electroluminescent device, and the touch structure is located between the color filtering layer and the modified optically transparent adhesive layer; or,
the modified optically transparent adhesive layer is located on the side of the color filtering layer close to the organic electroluminescent device, and the touch structure is located on a side of the modified optically transparent adhesive layer close to the organic electroluminescent device; or,
the modified optically transparent adhesive layer is located on the side of the color filtering layer close to the organic electroluminescent device, and the touch structure is located on the side of the color filtering layer away from the organic electroluminescent device; or,
the modified optically transparent adhesive layer is located on the side of the color filtering layer close to the organic electroluminescent device, and the touch structure is located between the color filtering layer and the modified optically transparent adhesive layer; or,
the modified optically transparent adhesive layer is located on the side of the color filtering layer away from the organic electroluminescent device, and the touch structure is located on a side of the modified optically transparent adhesive layer away from the color filtering layer.

* * * * *